United States Patent [19]

Teshima et al.

[11] Patent Number: 5,413,164
[45] Date of Patent: May 9, 1995

[54] HEATING FURNACE IN COMBINATION WITH ELECTRONIC CIRCUIT MODULES

[75] Inventors: Yasuhiro Teshima, Oyama; Mamoru Niishiro, Yuki; Michinori Matsubayashi, Utsunomiya, all of Japan

[73] Assignee: Fujitsu Limited, Kawasaki, Japan

[21] Appl. No.: 751,944

[22] Filed: Aug. 29, 1991

[30] Foreign Application Priority Data

Aug. 30, 1990 [JP] Japan .................. 2-229355

[51] Int. Cl.$^6$ ............... F25B 29/00; B23K 37/04; B23K 31/02; F27B 9/24
[52] U.S. Cl. ....................... 165/11.1; 165/12; 165/22; 165/26; 165/30; 165/48.1; 165/61; 228/9; 432/18; 432/34; 432/53
[58] Field of Search ............... 165/61, 11.1, 12, 22, 165/26, 30, 48.1; 432/18, 77, 34, 53, 52, 81; 228/8, 9, 10

[56] References Cited

U.S. PATENT DOCUMENTS

| | | | |
|---|---|---|---|
| 1,727,192 | 9/1929 | Baily | 165/61 |
| 2,968,894 | 1/1961 | Hess | 432/18 |
| 3,100,106 | 8/1963 | Bielenberg et al. | 432/18 |
| 3,168,298 | 2/1965 | Cook et al. | 432/18 |
| 3,517,916 | 6/1970 | Ross et al. | 165/61 |
| 4,221,559 | 9/1980 | Feichtner et al. | 432/18 |
| 4,486,173 | 12/1984 | Hieber et al. | 432/34 |
| 4,605,161 | 8/1986 | Motomiya et al. | 432/53 |
| 4,698,774 | 10/1987 | Abe et al. | 228/9 |
| 4,771,929 | 9/1988 | Bahr et al. | 228/9 |
| 4,775,776 | 10/1988 | Rahn et al. | 228/9 |
| 4,807,794 | 2/1989 | Hess | 228/10 |
| 4,832,249 | 5/1989 | Ehler | 228/9 |
| 4,966,547 | 10/1990 | Okuyama et al. | 432/18 |
| 5,147,083 | 9/1992 | Halstead et al. | 432/77 |

FOREIGN PATENT DOCUMENTS

| | | |
|---|---|---|
| 60-171742 | 9/1985 | Japan . |
| 1-108612 | 4/1989 | Japan . |
| 1-225195 | 9/1989 | Japan . |
| 407674 | 12/1973 | U.S.S.R. ................. 228/9 |

Primary Examiner—John K. Ford
Attorney, Agent, or Firm—Armstrong, Westerman, Hattori, McLeland & Naughton

[57] ABSTRACT

For use in the fabrication of electronic circuit modules, there is provided a heating furnace which can be arbitrarily set in a desired temperature profile. The furnace includes a plural number of independently controllable heaters located in spaced positions to provide a plural number of heating zones in the furnace, and a plural number of cooling panels provided in the heating zones of the respective heaters. Each heater is independently controlled according to a specified type of substrate to establish a temperature profile for the specified substrate type in the furnace to carry out the curing of a sealing synthetic resin material of a semiconductor device and the reflow soldering of surface mounting devices in one and single furnace.

3 Claims, 3 Drawing Sheets

HEATING FURNACE IN COMBINATION WITH ELECTRONIC CIRCUIT MODULES

BACKGROUND OF THE INVENTION

1. Field of the Art

This invention relates to a heating furnace for use in the fabrication of electronic circuit modules each having a plural number of circuit devices mounted on a substrate, and to a method for fabricating electronic circuit modules by the use of such a heating furnace.

2. Description of the Prior Art

To meet the space- and energy-saving requirements in electronic appliances such as communication equipment, many efforts have been directed to reductions in size of various components of electronic appliances, including printed wiring board units, electronic circuit modules for the printed wiring board units and other electronic parts. Along with the reductions in size, the broad adoption of the so-called "chip on board" technology, i.e., the technology of directly mounting bare semiconductor chips on a substrate or baseboard, has greatly changed the method of fabrication of printed wiring board units. In this regard, there have been demands for the development of a method for fabrication of electronic circuit modules, which is capable of efficiently assembling electronic circuit modules employing the "chip on board" technology without impairing the reliability of semiconductor devices.

According to a typical conventional method, electronic circuit modules are produced in the manner as follows.

(a) After attaching a semiconductor device to a substrate by die bonding using silver paste, terminals of the semiconductor devices are connected to bonding pads formed on the substrate by wire bonding using, for example, gold wires.

(b) In the next place, a synthetic resin material is applied to cover the semiconductor devices mounted on the substrate.

(c) The substrate is put in a furnace to heat and cure the resin material.

(d) Cream-like solder is applied, by silk screen printing or other suitable means, to the rear side of the substrate away from the front side having the semiconductor device.

(e) Surface mounting devices are then put on the cream solder.

(f) The substrate is placed in a furnace different from the one which was used in Step (c), for melting the solder and soldering the surface mounting devices in position.

In this manner, in the process of fabricating electronic circuit modules, the conventional method requires two independent furnaces, one being set at the curing temperature of the sealing synthetic resin material which covers the semiconductor device while the other one being set at the soldering temperature for the surface mounting devices. Namely, after curing the resin in one furnace, the surface mounting devices on the rear side of the substrate are set in position by reflow soldering in the other furnace.

Thus, the above-described conventional method involves complicate steps in the fabrication process of electronic circuit modules, and has a problem that, due to the time interval between the respective heating steps, the sealing resin material which covers the semiconductor device tends to absorb moisture before soldering the surface mounting devices on the other side of the substrate, causing rupture of the semiconductor device in some cases at the time of the reflow soldering. Besides, the moisture absorption by the resin material might result in its defoliation from the substrate. Even slight defoliation, which initially causes no trouble to the semiconductor device, might gradually deteriorate the semiconductor device over an extended period of time and give rise to a serious problem which is detrimental to the reliability of the electronic circuit modules.

SUMMARY OF THE INVENTION

It is therefore an object of the present invention to provide a heating furnace to be used in the fabrication process of electronic circuit modules for simultaneously carrying out the curing of the sealing resin material with the reflow soldering of the surface mounting devices.

It is another object of the present invention to provide a method for the fabrication of electronic circuit modules by the use of a heating furnace which is provided with at least first and second heating zones and which is capable of setting the furnace arbitrarily in a desired temperature profile to carry out the curing of the sealing resin material simultaneously with the reflow soldering of the surface mounting devices on the rear side of the substrate.

In accordance with an aspect of the present invention, there is provided a heating furnace for use in the fabrication of electronic circuit modules each having a plural number of circuit devices mounted on a substrate, the furnace comprising: a plural number of heater means located in spaced positions in a tandem fashion to provide a plural number of heating zones in the furnace; a heater controller adapted to control the respective heater means independently of each other; a plural number of cooling means provided in the heating zones of the respective heater means; a plural number of exhaust fans for discharging exhaust air from the furnace; a transfer means arranged to transfer substrates with the circuit devices mounted thereon through the heating zones of the respective heater means; and a plural number of temperature sensors for detecting the furnace temperatures in the heating zones of the respective heater means.

In accordance with another aspect of the present invention, there is provided a heating furnace for use in the fabrication of electronic circuit modules each having a plural number of circuit devices mounted on a substrate, the furnace comprising: a plural number of heater means located in spaced positions in a tandem fashion to provide a plural number of heating zones in the furnace; a heater controller adapted to control the respective heater means independently of each other; a plural number of cooling means provided in the heating zones of the respective heater means; a plural number of exhaust fans for discharging exhaust air from the furnace; a transfer means arranged to transfer substrates with the circuit devices mounted thereon through the heating zones of the respective heater means; a temperature profile memory means adapted to store predetermined furnace temperature profiles for various types of substrates; an ID code reading means adapted to read in the ID code on a substrate to be treated in the furnace; a controller adapted to select a temperature profile for the substrate type corresponding to the ID code read in by the ID code reading means and to control the heater means, cooling means and exhaust fans independently to establish the selected temperature profile in the furnace; and a plural number of temperature sensors for detecting the furnace temperatures in the heating zones of the respective heater means.

According to still another aspect of the present invention, there is provided a method for fabricating electronic circuit modules by the use of a heating furnace having at least first and second heating zones and being capable of setting arbitrarily a desired temperature profile in the furnace, the method comprising: mounting a semiconductor device directly on the front side of a substrate; sealing the semiconductor device with a synthetic resin material; applying cream solder on the rear side of the substrate; placing surface mounting devices on the cream solder; heating the first heating zone to a first temperature to cure the resin material; and heating the second heating zone to a second temperature to melt the cream solder for soldering the surface mounting devices in position.

With the furnace arrangement according to the invention, the curing of a sealing resin material over the semiconductor device and the soldering of surface mounting devices can be effected continuously within one furnace, permitting to fabricate electronic circuit modules efficiently without deteriorating the reliability of the semiconductor device.

The above and other objects, features and advantages of the present invention and the manner of realizing them will become more apparent, and the invention itself will best be understood from a study of the following description and appended claims taken in conjunction with the accompanying drawings which show some preferred embodiments of the invention.

DESCRIPTION OF PREFERRED EMBODIMENTS

Figure 1:
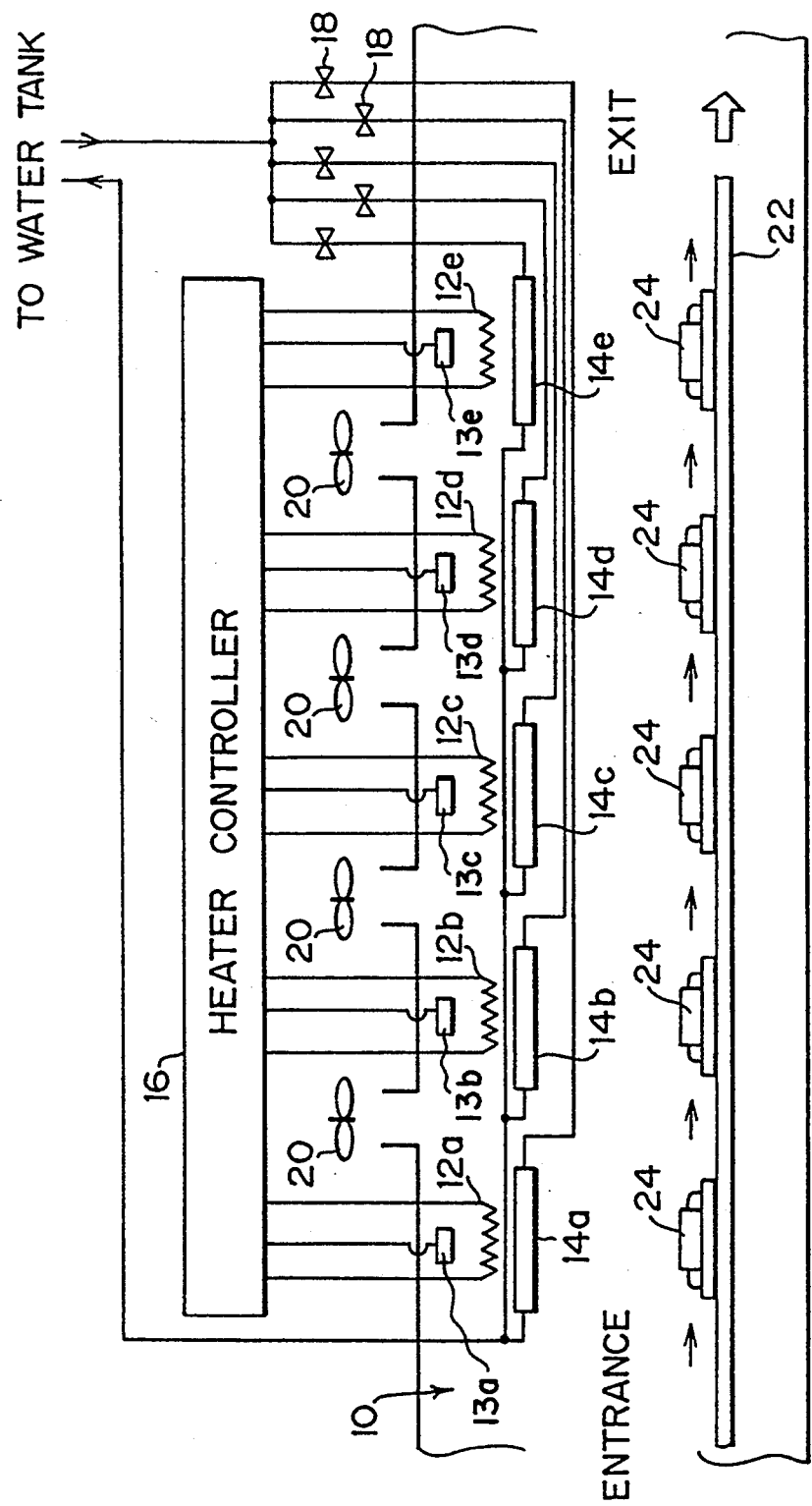
FIG. 1 is a diagrammatic view of a heating furnace embodying the present invention.

Referring first to FIG. 1, there is shown a heating furnace arrangement in one embodiment of the invention, in which heaters 12a to 12e are provided in a heating furnace 10, for example, at intervals of 30 cm, along with cooling panels 14a to 14e which are positioned opposingly to the respective heaters. The heater 12a to 12e are each controlled by a heater controller 16. The cooling panels 14a to 14e are connected to a water tank through valves 18 respectively.

The heater controller 16 is adapted to supply necessary electric power to the heaters 12a to 12e independently of each other to set the heating furnace 10 in a desired temperature profile. Cooling water is supplied to the respective panels 14a to 14e independently of each other by opening and closing the valves 18. An exhaust fan 20 is provided between the adjacent heaters to discharge exhaust air from the heating furnace 10 whenever necessary. Substrates 24 which are placed on a conveyer 22 are transferred from entrance to exit of the furnace 10 while undergoing heating to specified temperatures.

In the fabrication of electronic circuit modules by the use of the heating furnace 10 according to the present invention, the first heater 12a is controlled to heat up its heating zone, for example, to a temperature of 150° C. to cure the sealing resin material on the semiconductor device for about 30 minutes. On the other hand, the zones of the heaters 12b to 12e are used for reflow soldering of the surface mounting devices on the substrates 24 which are being transferred by the conveyer 22. As a temperature profile for the reflow soldering, the heaters 12b to 12c are controlled, for example, to a temperature of about 150° C. for preliminary heating of the cream solder, while the heater 12e is controlled to a temperature of about 260° C. for melting the cream solder for the reflow soldering.

As shown in FIG. 1, the furnace is provided with temperature sensors 13a to 13e in the heating zones of the heaters 12a to 12e, respectively, to thereby constantly monitor the furnace temperatures. On the basis of the detected temperatures, the heater controller 16 is operated either manually or automatically to set the furnace in a desired temperature profile.

For energy saving purposes, the heating furnace 10 is so constructed as to minimize heat dissipation. In case of a heating furnace with less heat dissipation, it may take a long time to lower the furnace temperature naturally on changing the substrates to a different type which needs lower temperature settings. Therefore, cooling water is fed to the cooling panels 14a to 14e through the valves 18 to lower the furnace temperatures quickly when necessary.

According to the present embodiment, the heating furnace is provided with a plural number of heaters which can be controlled to a specific temperature independently of each other, along with the cooling panels which are located correspondingly to the respective heaters, so that it can be set in a required temperature profile in a prompt manner.

Figure 2:
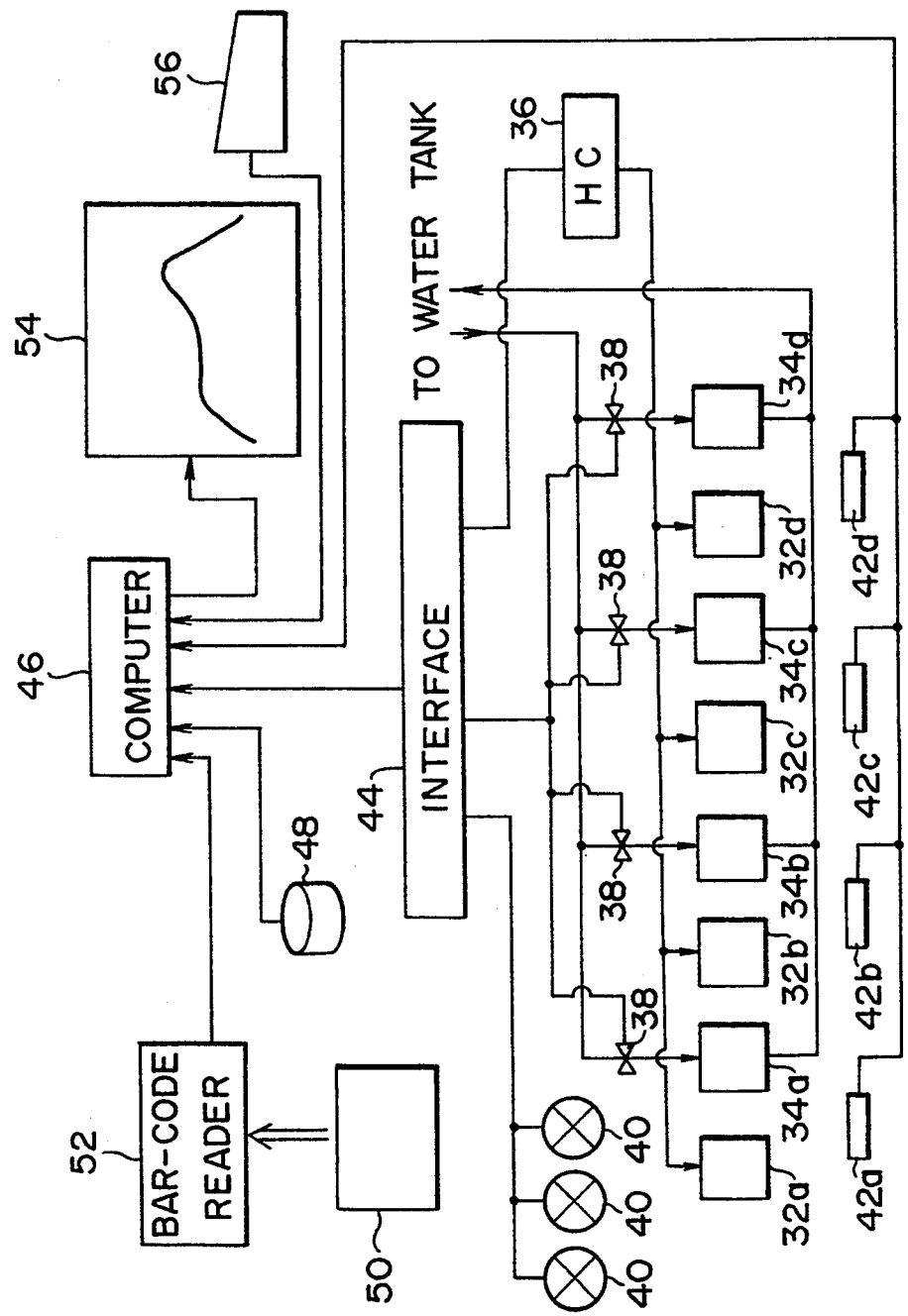
FIG. 2 is a diagrammatic view of another embodiment of the invention.

Referring now to FIG. 2, there is illustrated another embodiment of the invention, which is adapted to set the temperature profile of the furnace automatically. Similarly to the first embodiment shown in FIG. 1, the furnace is provided, in tandem, with a number of heaters 32a to 32d which can be controlled to a desired temperature independently of each other by a heater controller 36. Correspondingly to the heaters 32a to 32d, cooling panels 34a to 34d are provided in the respective heating zones, the cooling panels 34a to 34d being connected to a water tank through valves 38. A plural number of exhaust fans 40 are provided at suitable intervals to discharge exhaust air from the furnace. The heat controller 36, valves 38 and exhaust fans 40 are connected to a computer 46 through an interface 44.

The heating furnace of this embodiment is further provided with temperature sensors 42a to 42d in the heating zones of the respective heaters 32a to 32d, the temperature sensors 42a to 42d constantly supplying signals of detected temperatures to the computer 46. The computer 46 is connected to a profile memory for storing temperature profiles for various types of substrates, a bar code reader 52 for reading bar codes on the substrates 50, a display 54 for indicating the results of detection by the temperature sensors 42a to 42d, and a keyboard 56.

Prior to feeding a substrate 50 into the heating furnace, the bar code reader 52 reads the bar code on the substrate 50 and supplies the computer 46 with a signal indicative of the type of the substrate 50. The computer then reads out a temperature profile corresponding to the specified type of substrate from the profile memory 48, controlling the heater controller 36, valves 38 and exhaust fans 40 in such a manner as to establish a specified temperature profile within the furnace.

The temperatures in the heating zones of the respective heaters 32a to 32d are sequentially detected by the temperature sensors 42a to 42d, indicating the results of detection on the display 54 through the computer 46, which maintains the specified temperature profile in the furnace automatically through feedback control according to the difference between the detected temperatures and selected temperature settings. The temperature settings can be altered by entering new data through the keyboard 56 to rewrite the temperature of a particular zone in the profile memory 48, for example, from T1 to T1'.

Referring now to FIGS. 3a to 3e, according to the method of the invention, the above-described heating furnace, which can be arbitrarily set in a desired temperature profile, is used for fabrication of electronic circuit modules in the manner as follows.

Figure 3A:
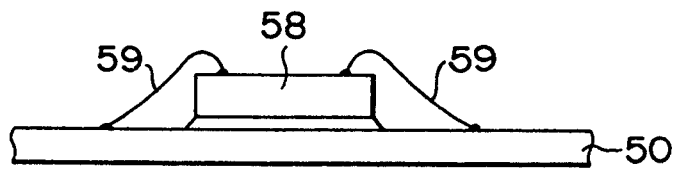
FIG. 3 shows the steps for fabricating an electronic circuit module according to the method of the invention.
Figure 3B:
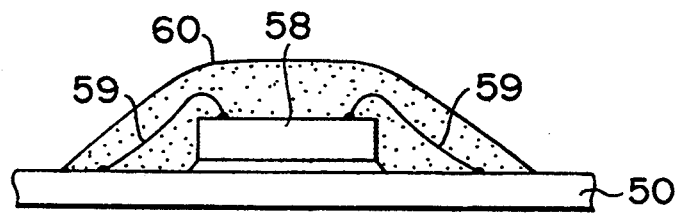

As shown particularly in FIG. 3a, a semiconductor device 58 is mounted on a substrate 50 by die bonding, for example, using silver paste, and then terminals of the semiconductor device 58 are connected to bonding pads on the substrate 50 by wire bonding, for example, using gold wires 59. Then, as shown in FIG. 3b, a synthetic resin material 60 such as epoxy resin, for example, is applied to cover the semiconductor device 58 which is mounted on the substrate 50.

Figure 3C:
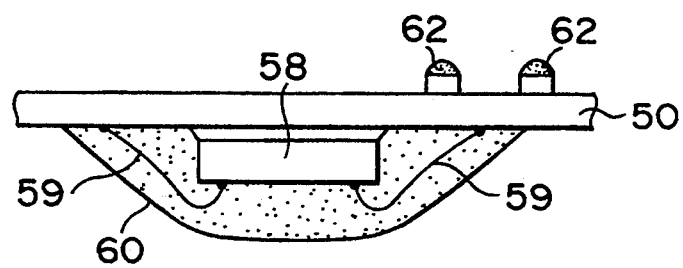
Figure 3D:
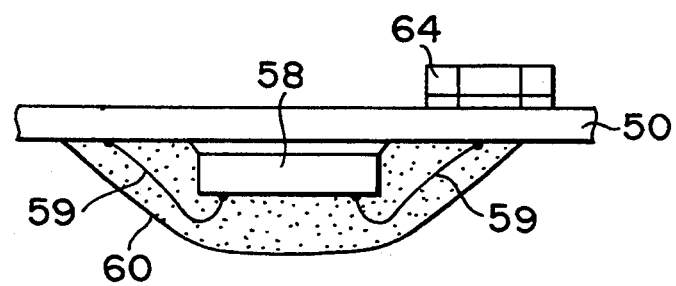

After turning the substrate 50 upside down, cream solder 62 is applied on the rear side of the substrate 50 as shown in FIG. 3c, for example, by silk screen printing. Thereafter, as shown in FIG. 3d, a surface mounting device 64 is put on the cream solder 62.

Figure 3E:
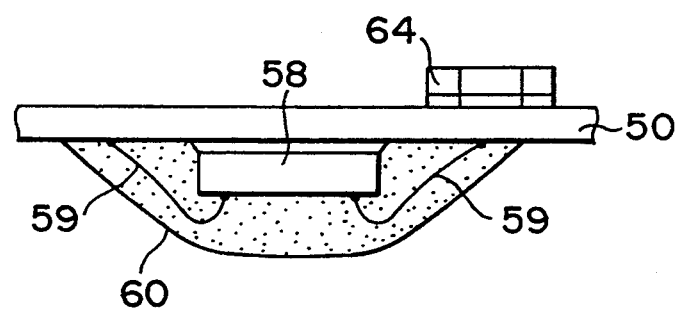

In this state, the substrate 50 is put in the heating furnace as shown in FIG. 1 or FIG. 2, and retained for a predetermined time length in the resin curing zone which is heated to the temperature T1 for curing the covering resin material 60. The temperature T1 is in the range of about 100° C. to 200° C., preferably in the range of 120° C. to 160° C. The time of retention is in the range of about 30 minutes to 4 hours, and in the range of about 30 minutes to 1 hour in case the sealing synthetic resin material 60 is an epoxy resin. After curing the resin 60, the substrate 50 is transferred by the conveyer through the reflow soldering zone of the furnace which is heated to the temperature T2 to melt the cream solder 62 for reflow soldering of the surface mounting device 64. In this regard, it is desirable to employ two-step heating for the reflow soldering, preliminarily heating the substrate at about 150° C. for about several minutes in the first step and raising the temperature to about 260° C. in the second step to melt the cream solder 62 for soldering the surface mounting device 64 in position. The time for the reflow soldering is normally in the range of about 5 to 6 minutes. The condition of the substrate 50 after the reflow soldering is shown in FIG. 3e.

Although the semiconductor device 58 is mounted on the substrate prior to the surface mounting device 64 in the above-described method, they may be mounted in an inverse order if desired. In such a case, it becomes necessary to tentatively fix the surface mounting device by the use of an adhesive or other suitable means since otherwise they would fall off when the substrate is turned upside down for die bonding of the semiconductor device.

What is claimed is:

1. A heating furnace in combination with a plurality of circuit devices, all of said plurality of circuit devices requiring heat treatments of different temperatures, said furnace for use in the fabrication of electronic circuit modules each having said plurality of circuit devices mounted on a substrate, said circuit devices requiring a heat treatment of a first temperature within a portion of said furnace and requiring a heat treatment of a second temperature within another portion of said furnace, said furnace comprising:

a plurality of heater means, spaced apart from each other, for providing a plurality of heating zones necessary to fabricate, in said furnace, said electronic circuit modules each having said plurality of circuit devices mounted on said substrate, wherein said heating zones include a first heating zone for heat treating the circuit devices and a second heating zone for heat treating the circuit devices;

a heater controller means for controlling the respective heater means independently of each other;

a plurality of cooling means, provided in said heating zones of the respective heater means, for cooling respective heating zones;

a plurality of exhaust fans for discharging exhaust air from the furnace;

a transfer means for transferring a substrate with the circuit devices mounted thereon through said heating zones of the respective heater means;

a temperature profile memory means for storing predetermined furnace temperature profiles for various types of substrates;

an ID code reading means for reading in an ID code on the substrate to be treated in the furnace;

a controller means, operably connected to each of the heater means, cooling means and exhaust fans, for selecting a temperature profile for the substrate type corresponding to the ID code read in by the ID reading means and for independently controlling the heater means, cooling means and exhaust fans to establish the selected temperature profile in said furnace; and a plurality of temperature sensors for detecting the furnace temperatures in said heating zones of the respective heater means.

2. A heating furnace as defined in claim 1, wherein said cooling means are water cooling panels independently connectible to a cooling water supply through on-off valves operated by said controller.

3. A heating furnace as defined in claim 1, further comprising a keyboard and a display connected to said controller, said temperature profiles in said temperature profile memory means being alterable by entering new data for a specific type of substrate through said keyboard.

* * * * *